United States Patent
Thacker et al.

(10) Patent No.: US 8,971,676 B1
(45) Date of Patent: Mar. 3, 2015

(54) HYBRID-INTEGRATED PHOTONIC CHIP PACKAGE

(71) Applicant: Oracle International Corporation, Redwood City, CA (US)

(72) Inventors: Hiren D. Thacker, San Diego, CA (US); Ashok V. Krishnamoorthy, San Diego, CA (US); Robert David Hopkins, II, Foster City, CA (US); Jon Lexau, Beaverton, OR (US); Ronald Ho, Mountain View, CA (US); John E. Cunningham, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/047,918

(22) Filed: Oct. 7, 2013

(51) Int. Cl.
*G02B 6/12* (2006.01)
(52) U.S. Cl.
CPC ........................................ *G02B 6/12* (2013.01)
USPC ............................................................ 385/14
(58) Field of Classification Search
CPC ..... G02B 6/428; G02B 6/4281; H05K 1/0274
See application file for complete search history.

(56) References Cited

U.S. PATENT DOCUMENTS 8,290,008 B2 * 10/2012 Andry et al. .................... 372/36
8,548,288 B2 10/2013 Raj
2012/0051695 A1 * 3/2012 Harada et al. .................. 385/39
2013/0015578 A1 1/2013 Thacker
2014/0225273 A1 * 8/2014 Thacker et al. ............... 257/774

OTHER PUBLICATIONS

Thacker, Hiren D. et al. "Flip-Chip Integrated Silicon Photonic Bridge Chips for Sub-Picojoule Per Bit Optical Links", IEEE ECTS 2010 proceedings, 2010 Electronic Components and Technology Conference.
Cunningham, John, et al., "Scaling Hybrid-Integration of Silicon Photonics in Freescale 130nm to TSMC 40nm-CMOS VLSI drivers for low power communications," IEEE ECTC 2012.
Shubin, Ivan, et al., "Integrating Through Silicon Vias with Solder Free, Compliant Interconnects for Novel, Large Area Interposers," IEEE ECTC 2012.

(Continued)

*Primary Examiner* — Omar R Rojas
(74) *Attorney, Agent, or Firm* — Park, Vaughan, Fleming & Dowler LLP; Steven E. Stupp

(57) ABSTRACT

A chip package includes an optical integrated circuit (such as a hybrid integrated circuit) and an integrated circuit that are adjacent to each other on the same side of a substrate in the chip package. The integrated circuit includes electrical circuits, such as memory or a processor, and the optical integrated circuit communicates optical signals with very high bandwidth. In addition, an input/output (I/O) integrated circuit is coupled to the optical integrated circuit between the substrate and the optical integrated circuit. This I/O integrated circuit includes high-speed I/O circuits and energy-efficient driver and receiver circuits and communicates with optical devices on the optical integrated circuit. By integrating the optical integrated circuit, the integrated circuit and the I/O integrated circuit in close proximity, the chip package may facilitate improved performance compared to chip packages with electrical interconnects.

19 Claims, 11 Drawing Sheets

(56) References Cited

OTHER PUBLICATIONS

Zhang, Chaoqi et al., "Gold Passivated Mechanically Flexible Interconnects (MFIs) with High Elastic Deformation," IEEE ECTC 2012.

Kang, Uksong, et al., "8Gb 3D DDR3 DRAM Using Through-Silicon-Via Technology," IEEE ISSCC 2009.

* cited by examiner

HYBRID-INTEGRATED PHOTONIC CHIP PACKAGE

GOVERNMENT LICENSE RIGHTS

This invention was made with United States government support under Agreement No. HR0011-08-9-0001 awarded by DARPA. The United States government has certain rights in the invention.

CROSS-REFERENCE TO RELATED APPLICATIONS

This application is related to U.S. Non-provisional patent application Ser. No. 14/047,910, entitled "Hybrid-Integrated Photonic Chip Package with an Interposer," by Hiren D. Thacker, Frankie Y. Liu, Robert D. Hopkins, Jon Lexau, Xuezhe Zheng, Guoliang Li, Ivan Shubin, Ronald Ho, John E. Cunningham, and Ashok V. Krishnamoorthy, filed on 7 Oct. 2013; and to U.S. Non-provisional patent application Ser. No. 14/047,978, entitled "Hybrid-Integrated Photonic Chip Package with an Interposer," by Hiren D. Thacker, Ashok V. Krishnamoorthy, Robert D. Hopkins, Jon Lexau, Xuezhe Zheng, Ronald Ho, Ivan Shubin, and John E. Cunningham, filed on 7 Oct. 2013, the contents of both of which are herein incorporated by reference.

BACKGROUND

1. Field

The present disclosure generally relates to a chip package that accommodates semiconductor chips. More specifically, the present disclosure relates to a hybrid-integrated chip package that includes a substrate with adjacent payload and photonic chips.

2. Related Art

As integrated-circuit (IC) technology continues to scale to smaller critical dimensions, it is increasingly difficult for existing interconnection technologies to provide suitable communication characteristics, such as: high bandwidth, low power, reliability and low cost. Engineers and researchers are investigating a variety of interconnect technologies to address these problems, and to enable future high-density, high-performance systems.

One interconnect technology to address these challenges, which is the subject of ongoing research, is optical communication. In principle, optical communication can be used to communicate large amounts of data. However, while photonic technologies based on vertical cavity surface-emitting lasers (VCSELs) and optical fibers are typically a convenient and cost-effective solution to communicate modest amounts of data in certain parts of systems (such as between racks and, in certain cases, between boards within a rack), it is often difficult to scale these photonic components to meet the bandwidth, size, and power requirements of input/output (I/O) interfaces for future chips.

Alternatively, optical interconnects or links based on silicon photonics are attractive candidates for interconnect technology because they can be readily scaled on optical integrated circuits. However, it can be difficult to integrate optical integrated circuits with conventional integrated circuits in existing chip packages.

Hence, what is needed is a chip package that does not suffer from the above-described problems.

SUMMARY

One embodiment of the present disclosure provides a chip package that includes: an integrated circuit having a front surface with integrated-circuit connector pads; integrated-circuit electrical connectors electrically coupled to the integrated-circuit connector pads; a substrate having a top surface, facing the front surface, with first substrate connector pads electrically coupled to the integrated-circuit electrical connectors, and second substrate connector pads; and optical-integrated-circuit electrical connectors electrically coupled to the second substrate connector pads. Moreover, the chip package includes an optical integrated circuit having a front surface, facing the top surface, with optical-integrated-circuit connector pads electrically coupled to the optical-integrated-circuit electrical connectors, where the optical integrated circuit is proximate to the integrated circuit on a same side of the substrate, and the optical integrated circuit communicates optical signals. Furthermore, the chip package includes an input/output (I/O) integrated circuit between the front surface of the optical integrated circuit and the top surface of the substrate, where the I/O integrated circuit is coupled to the optical integrated circuit, and the I/O integrated circuit contains high-speed I/O circuits as well as energy-efficient driver and receiver circuits to communicate with the optical devices on the optical integrated circuit. It may also serialize/deserialize data Note that the integrated circuit may be adjacent to the optical integrated circuit.

Additionally, the substrate includes: third substrate connector pads disposed on a bottom surface on an opposite side of the substrate from the top surface; and through-substrate vias (TSVs) electrically coupling the first substrate connector pads to the third substrate connector pads, and the second substrate connector pads to the third substrate connector pads. The TSVs may convey power and ground to the integrated circuit and the optical integrated circuit.

In some embodiments, the chip package includes a ramp-stack chip package electrically coupled to the third substrate connector pads, where the ramp-stack chip package includes multiple parallel substrates arranged at an oblique angle relative to the bottom surface. Moreover, the third substrate connector pads may have a lower pitch than a pitch of the first substrate connector pads and a pitch of the second substrate connector pads.

Moreover, the optical integrated circuit may include: ramp-stack connector pads disposed on a back surface on an opposite side of the optical integrated circuit from the front surface; TSVs electrically coupling the optical-integrated-circuit connector pads to the ramp-stack connector pads; ramp-stack electrical connectors electrically coupled to the ramp-stack connector pads; and the ramp-stack chip package electrically coupled to the ramp-stack electrical connectors, where the ramp-stack chip package includes the multiple parallel substrates arranged at the oblique angle relative to the back surface.

Furthermore, the I/O integrated circuit may communicate with the integrated circuit via the substrate.

Additionally, the chip package may include an optical fiber edge coupled to the optical integrated circuit. Alternatively, the chip package may include an optical fiber vertically coupled to the optical integrated circuit. For example, the optical fiber may be coupled to the front surface of the optical integrated circuit and/or the optical fiber may be coupled to the back surface of the optical integrated circuit on the opposite side of the optical integrated circuit from the front surface of the optical integrated circuit.

In some embodiments, the chip package includes an optical source between the optical integrated circuit and the substrate, where the optical source is optically coupled to the front surface of the optical integrated circuit.

Note that the substrate may include: a ceramic, an organic material, a glass, and/or a semiconductor.

Moreover, the chip package may include a thermal-cooling mechanism on a back surface of the integrated circuit on an opposite side of the integrated circuit from the front surface of the integrated circuit.

Furthermore, the chip package may include an interposer between the front surface of the integrated circuit and the top surface of the substrate.

Another embodiment provides a system that includes a processor, a memory coupled to the processor and the chip package.

Another embodiment provides a method for communicating electrical signals between the integrated circuit and the optical integrated circuit. During the method, the electrical signals are conveyed from the integrated-circuit connector pads on the front surface of the integrated circuit to the first substrate connector pads on the top surface of the substrate via the integrated-circuit electrical connectors, where the front surface faces the top surface. Then, the electrical signals are conveyed via traces disposed on the substrate, where the traces electrically couple the first substrate connector pads and the second substrate connector pads on the top surface. Moreover, the electrical signals are conveyed from the second substrate connector pads to the optical-integrated-circuit connector pads on the front surface of the optical integrated circuit via the optical-integrated-circuit electrical connectors, where the front surface of the optical integrated circuit faces the top surface, and the optical integrated circuit is proximate to the integrated circuit on the same side of the substrate. Next, the electrical signals are communicated from the front surface of the optical integrated circuit to the I/O integrated circuit between the front surface of the optical integrated circuit and the substrate. Furthermore, the electrical signals and/or optical signals are communicated with optical devices of the optical integrated circuit using the I/O integrated circuit.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, a system that includes the chip package, and a technique for communicating electrical signals between an integrated circuit and an optical integrated circuit in the chip package are described. This chip package includes an optical integrated circuit (such as a hybrid integrated circuit) and an integrated circuit, which are adjacent to each other on the same side of a substrate in the chip package. The integrated circuit includes electrical circuits, such as memory or a processor, and the optical integrated circuit communicates optical signals with very high bandwidth. In addition, an input/output (I/O) integrated circuit is coupled to the optical integrated circuit between the substrate and the optical integrated circuit. This I/O integrated circuit serializes and deserializes data in the electrical signals communicated between the integrated circuit and the optical integrated circuit.

By integrating the optical integrated circuit, the integrated circuit and the I/O integrated circuit in close proximity, the chip package may facilitate improved performance compared to chip packages with electrical interconnects. In particular, the chip package may provide multi-terabit per second optical communication in conjunction with high-performance electrical circuits. In this way, the chip package may meet the escalating demands of off-chip bandwidth, while providing higher bandwidth density and improved energy efficiency compared to electrical interconnects.

We now describe the chip package. Hybrid integration is a pragmatic approach that allows silicon photonic devices and VLSI circuits to be combined. The chip package described here contains hybrid-integrated electronic-photonic elements, where the electronics and photonics have been built on individually optimized technology platforms and then bonded together using a low-parasitic flip-chip-assembly technique, such as thermocompression or reflow bonding.

Figure 1:
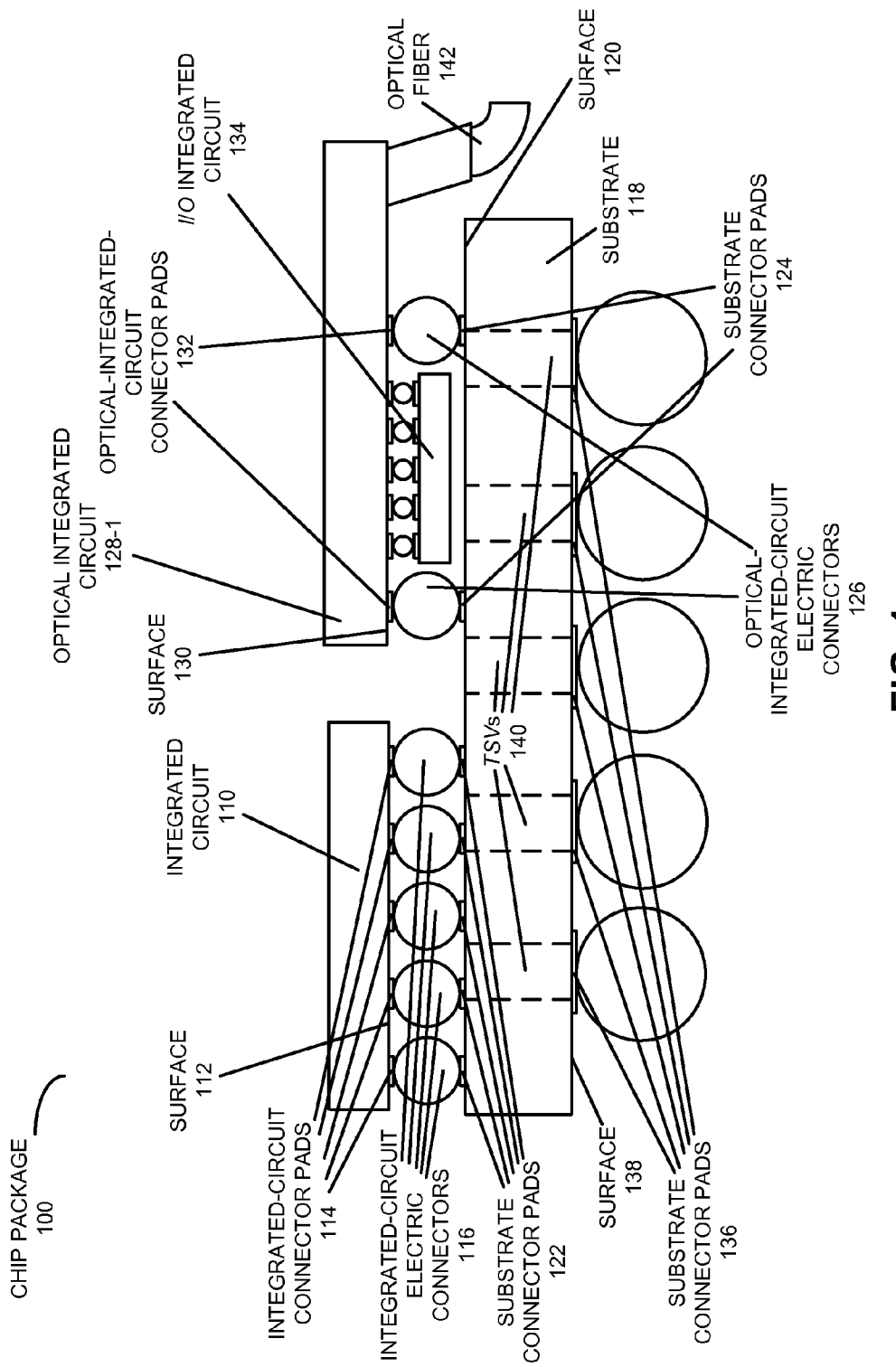
FIG. 1 is a block diagram illustrating a side view of a chip package in accordance with an embodiment of the present disclosure.

FIG. 1 presents a block diagram illustrating a side view of a chip package 100, such as a wavelength-division-multiplexing photonic input/output (I/O)-enabled hybrid-integrated chip package. In chip package 100, integrated circuit 110 (such as a switch chip or a high-performance processor that requires ultrahigh off-chip bandwidth, and which is sometimes referred to as a 'payload IC') may be flip-chip bonded to substrate 118. In particular, chip package 100 includes: integrated circuit 110 having a surface 112 with integrated-circuit connector pads 114; integrated-circuit electrical connectors 116 electrically coupled to integrated-circuit connector pads 114; a substrate 118 having a surface 120, facing surface 112, with substrate connector pads 122 electrically coupled to integrated-circuit electrical connectors 116, and substrate connector pads 124; and optical-integrated-circuit electrical connectors 126 electrically coupled to substrate connector pads 124. For example, substrate 118 may include: a ceramic, an organic material, a glass, and/or a semiconductor.

Moreover, chip package 100 includes an optical integrated circuit 128-1 (which is sometimes referred to as a 'photonic bridge chip' or a 'photonic IC') having a surface 130, facing surface 120, with optical-integrated-circuit connector pads 132 electrically coupled to optical-integrated-circuit electrical connectors 126, where optical integrated circuit 128-1 is proximate to integrated circuit 110 on a same side of substrate 118, and optical integrated circuit 128-1 communicates optical signals. As shown in FIG. 1, optical integrated circuit 128-1 is adjacent to integrated circuit 110. In an exemplary embodiment, optical integrated circuit 128-1 is fabricated on a silicon-on-insulator substrate and includes optical components, such as optical waveguides, modulators, photodetectors, etc.

Furthermore, chip package 100 includes an I/O integrated circuit 134 between surfaces 120 and 130, where I/O integrated circuit 134 is coupled to optical integrated circuit 128-1, and I/O integrated circuit 134 serializes/deserializes data in the electrical signals. For example, VLSI I/O integrated circuit 134 may be hybrid integrated onto a physically larger optical integrated circuit 128-1 and, in addition to interfacing optical integrated circuit 128-1 with energy-efficient photonic driver and receiver circuits, I/O integrated circuit 134 may serialize/deserialize data. Thus, I/O integrated circuit 134 may accept parallel data from integrated circuit 110, serialize the data and encode the data onto a photonic-modulator driver signal. Conversely, I/O integrated circuit 134 may accept serial electrical data from the photodetectors on optical integrated circuit 128-1, and may convert the electrical data into parallel inputs to transmit electrically to integrated circuit 110. However, other combinations of serial or parallel data transmission may also be used. In some embodiments, the integrated circuit-I/O integrated circuit interface consists of a multiple moderate-speed electrical links (e.g., 1-5 Gbps per channel), whereas the I/O integrated circuit-optical integrated circuit interface may include a smaller number of high-speed serial links (e.g., greater than 14 Gbps per channel).

Note that the hybrid integration may be achieved using a flip-chip attachment technique using thermocompression or reflow-bonded microbump technology. The bump and hybrid bond-pad sizes may be designed to minimize parasitic capacitance. The hybrid-integrated VLSI I/O integrated circuit 134 may be surrounded by a field of C4-type solder interconnects (e.g., C4 bumps, lead-free bumps, copper-pillar bumps, etc.). Consequently, I/O integrated circuit 134 may need to be thinned down to be shorter than the height of the collapsed C4 bumps to prevent interference with subsequent assembly of the hybrid component to substrate 118. Alternatively, compliant, rematable interconnects may be used instead of C4-type interconnects.

Moreover, hybrid-integrated optical integrated circuit 128-1 may be flip-chip attached adjacent to integrated circuit 110 with a small or minimal gap between the two to minimize the electrical chip-to-chip interconnect wire length. Integrated circuit 110 may also be flip-chip attached to substrate 118. In general, the density of flip-chip interconnects may ultimately be constrained by physical limitations in the package-substrate manufacturing process.

Figure 11:
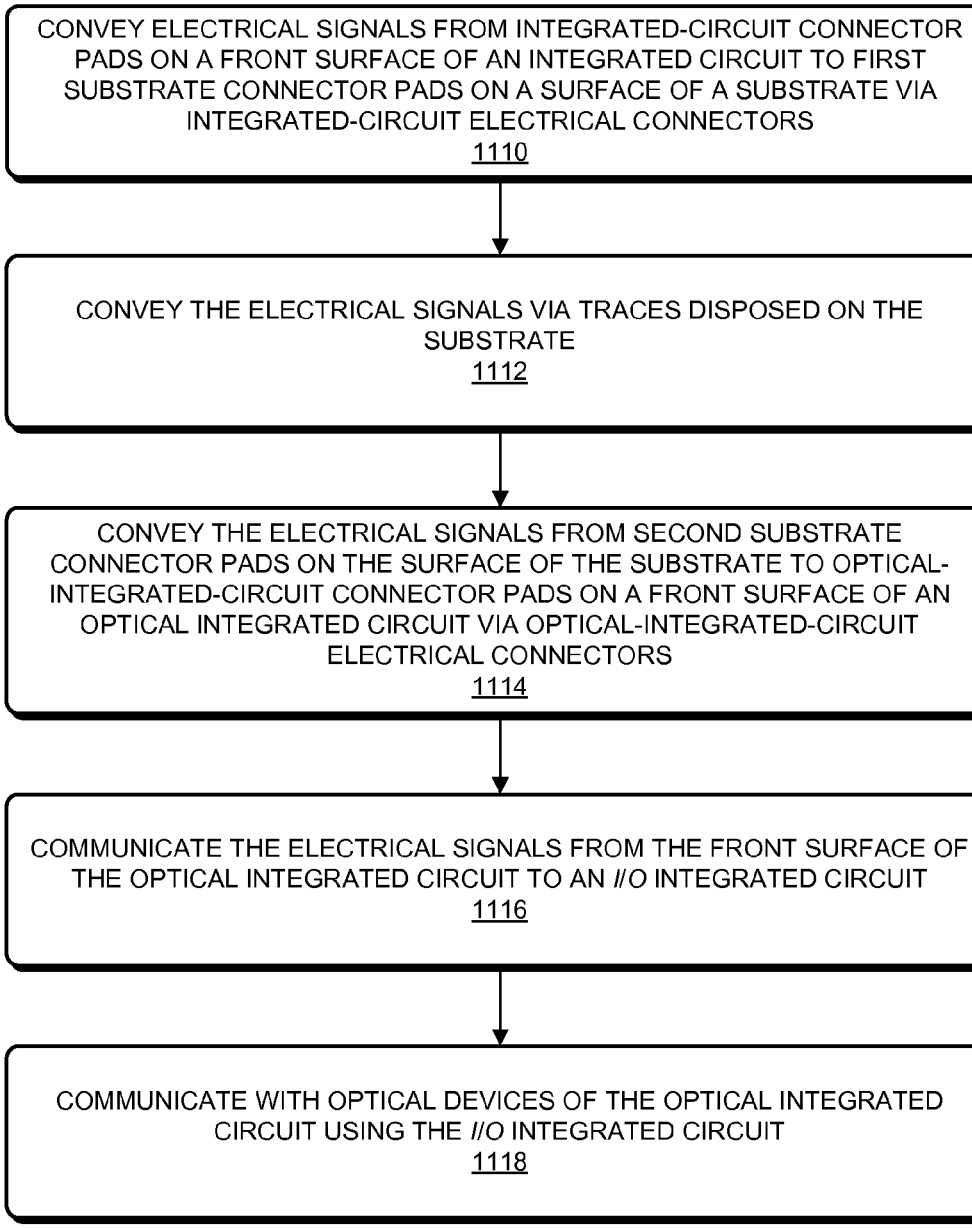
FIG. 11 is a flow diagram illustrating a method for communicating electrical signals between an integrated circuit and an optical integrated circuit in accordance with an embodiment of the present disclosure.

As described further below with reference to FIG. 11, I/O integrated circuit 134 may communicate with integrated circuit 110 via substrate 118. In particular, substrate 118 may include: substrate connector pads 136 disposed on a surface 138 on an opposite side of substrate 118 from surface 120; and through-substrate vias (TSVs) 140 electrically coupling substrate connector pads 122 to substrate connector pads 136, and substrate connector pads 124 to substrate connector pads 136. In addition, substrate 118 may include multiple layers of wiring on surfaces 120 and 138 for signal and power ground routing, as well as redistribution. Therefore, TSVs 140 may convey power and ground to integrated circuit 110 and optical integrated circuit 128-1, and optical integrated circuit 128-1 may convey power and ground to I/O integrated circuit 134.

During operation, integrated circuit 110 may communicate with I/O integrated circuit 134 via wiring on substrate 118, and on-chip wiring on optical integrated circuit 128-1. These electrical signals may also traverse two off-chip interconnects and microbump. Thus, the electrical signals may go from: integrated circuit 110 to substrate 118 via integrated-circuit electrical connectors 116; substrate 118 to optical integrated circuit 128-1 via optical-integrated-circuit electrical connectors 126; and optical integrated circuit 128-1 to I/O integrated circuit 134 via the microbumps. While this communication may involve a large number of moderate-speed rated off-chip interconnects on integrated circuit 110 and optical integrated circuit 128-1, this configuration minimizes the wire-length of ultrahigh speed electrical signals between the I/O integrated circuit 134 and optical integrated circuit 128-1.

A portion of optical integrated circuit 128-1 may extend beyond an edge of substrate 118. As shown in FIG. 1, and described further below with reference to FIGS. 2-4, this configuration may provide physical space for attachment of at least one optical fiber 142 to optical integrated circuit 128-1 (more may be used depending on the bandwidth requirements). This optical fiber may carry high-speed optical signals to and from chip package 100.

Figure 2:
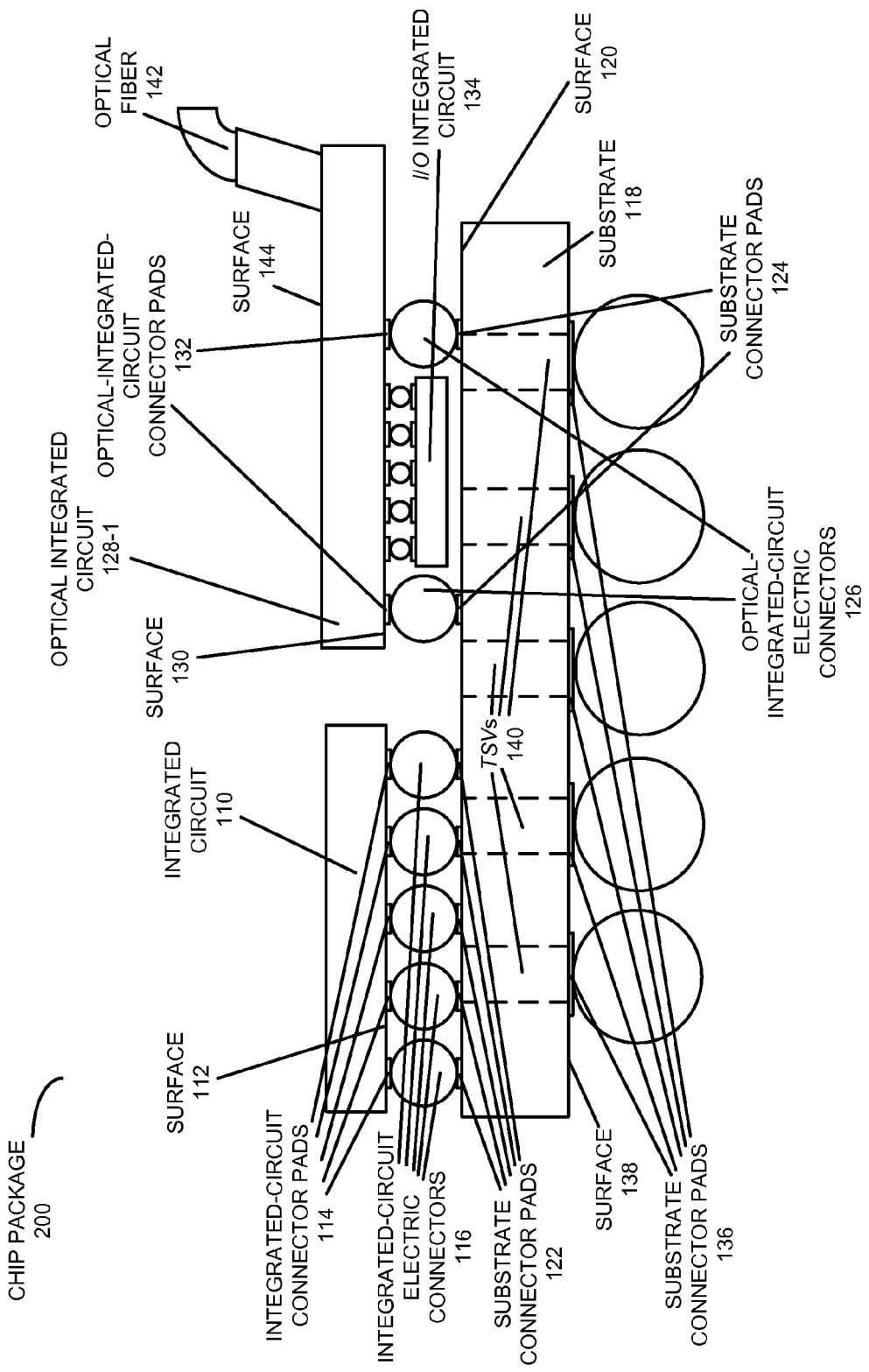
FIG. 2 is a block diagram illustrating a side view of a chip package in accordance with an embodiment of the present disclosure.

In particular, optical fiber 142 may be vertically coupled to surface 130 of optical integrated circuit 128-1. Alternatively, as shown in FIG. 2, which presents a block diagram illustrating a side view of a chip package 200, optical fiber 142 may be vertically coupled to surface 144 of optical integrated circuit 128-1 on the opposite side of optical integrated circuit 128-1 from surface 130.

Figure 3:
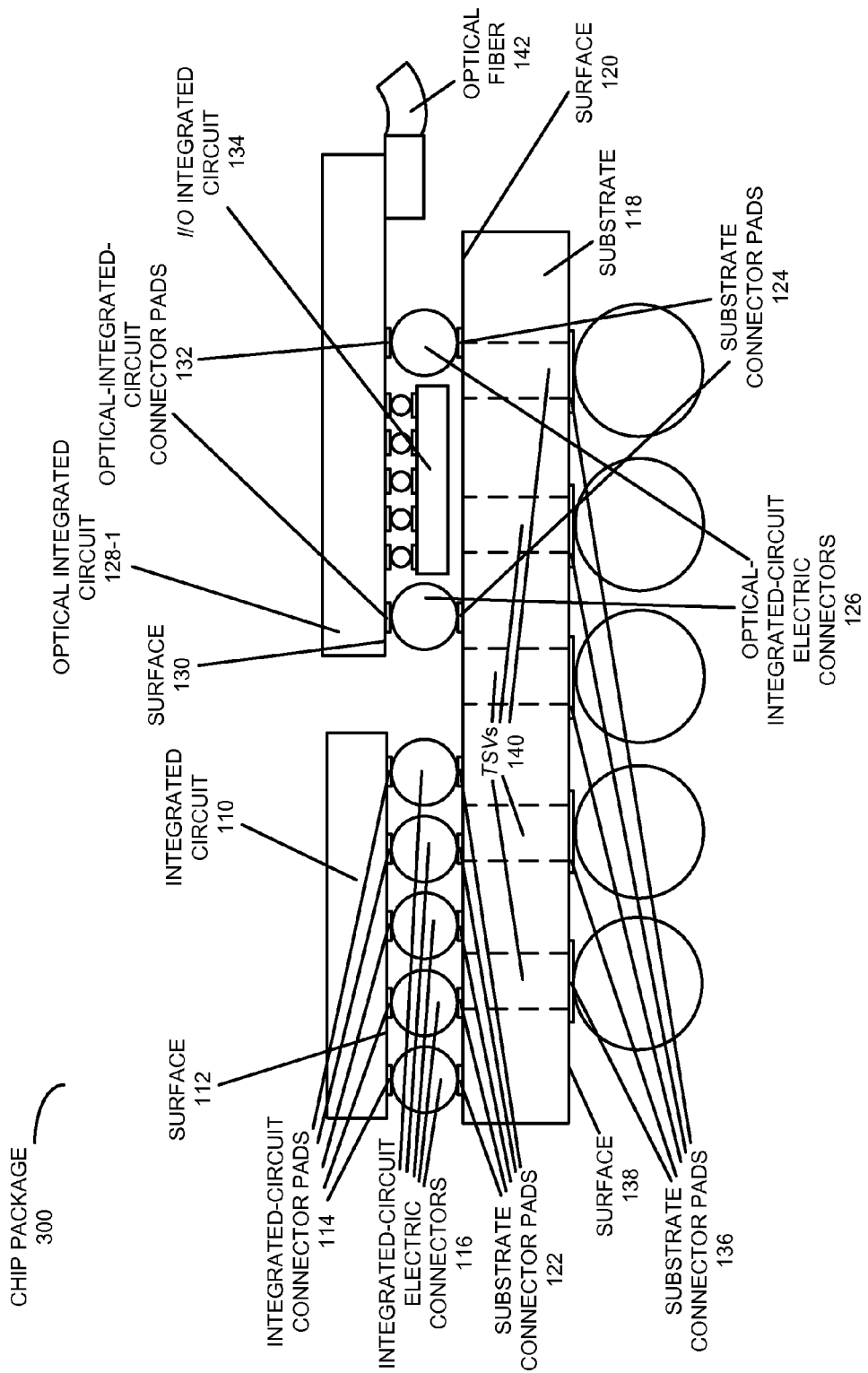
FIG. 3 is a block diagram illustrating a side view of a chip package in accordance with an embodiment of the present disclosure.
Figure 4:
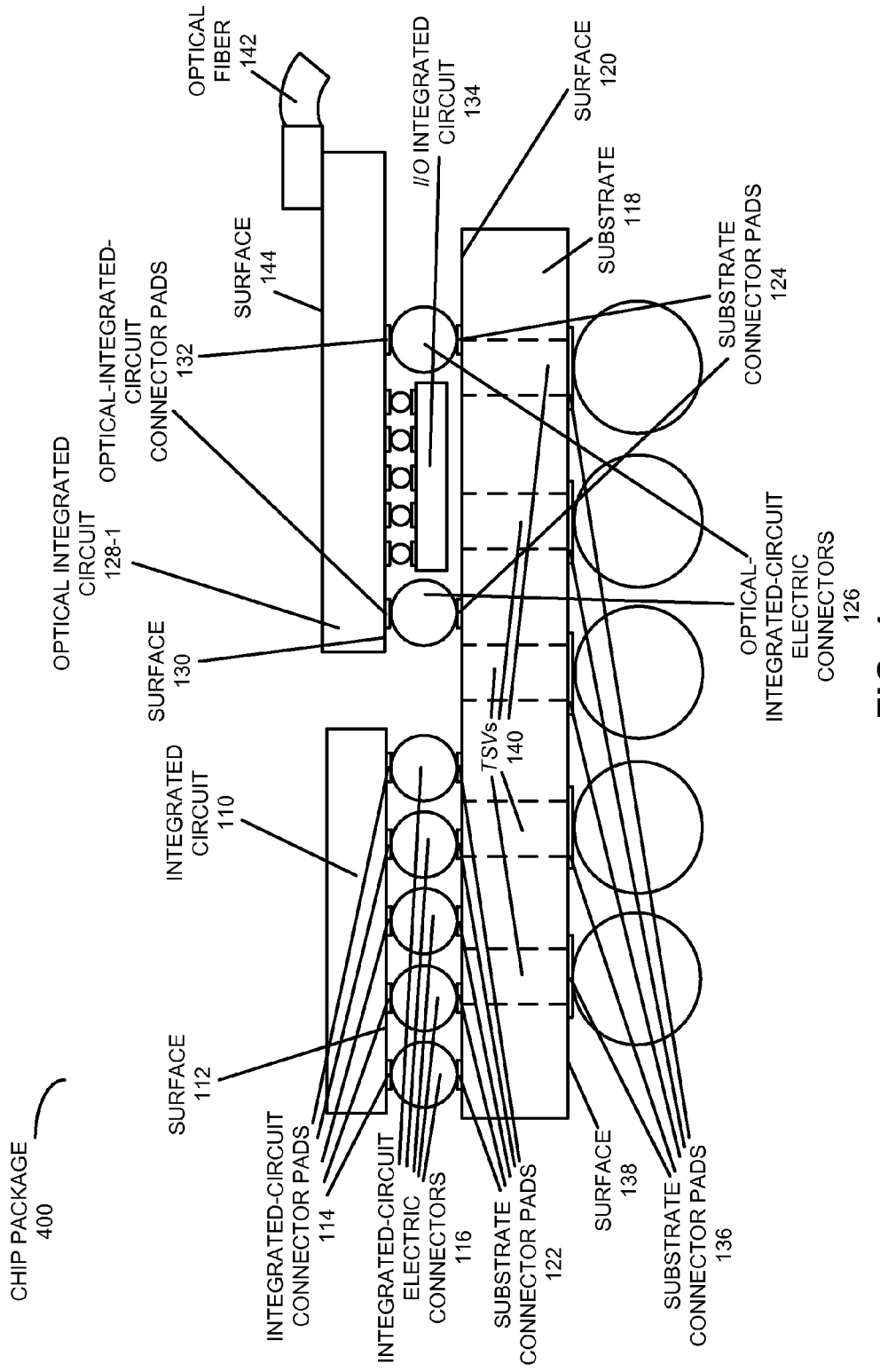
FIG. 4 is a block diagram illustrating a side view of a chip package in accordance with an embodiment of the present disclosure.

Alternatively, optical fiber 142 may be edge coupled to optical integrated circuit 128-1. For example, as shown in FIG. 3, which presents a block diagram illustrating a side view of a chip package 300, optical fiber 142 may be edge coupled to surface 130 of optical integrated circuit 128-1 and/or optical fiber 142 may be edge coupled to surface 144. This latter configuration is shown in FIG. 4, which presents a block diagram illustrating a side view of a chip package 400.

When optical fiber 142 is coupled to surface 144, optical integrated circuit 128-1 may include additional elements, such as minors, lenses and/or through optical vias (with or without an optically transmissive material). This configuration may leave surface 130 clear for attachment to substrate 118 and underfill. In addition, optical integrated circuit 128-1 and optical fiber 142 may not have to be pre-assembled.

Figure 5:
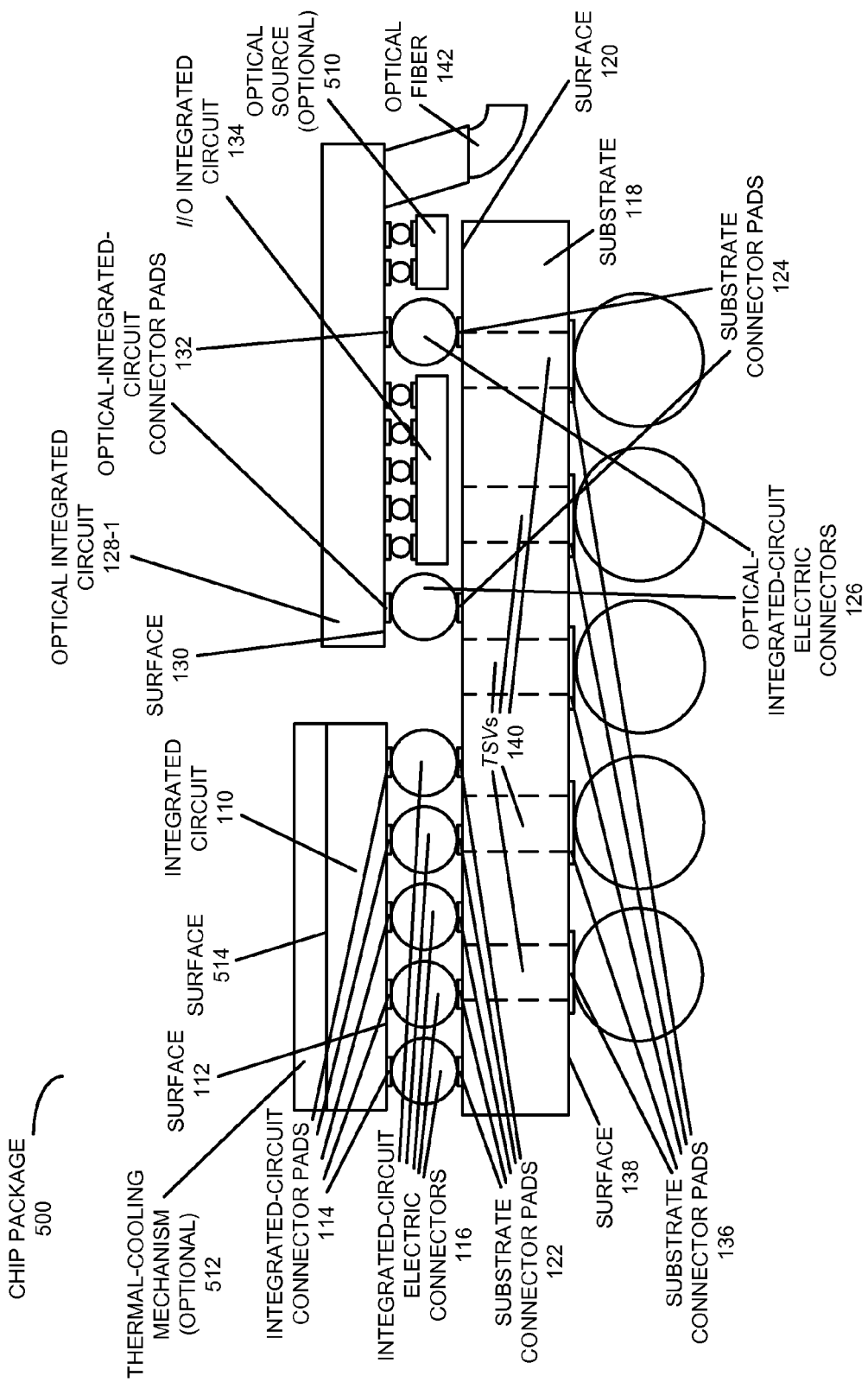
FIG. 5 is a block diagram illustrating a side view of a chip package in accordance with an embodiment of the present disclosure.

Optical fiber 142 (or another dedicated optical fiber) may be used to bring in light from an off-package optical source (e.g., one or more lasers). Alternatively, as shown in FIG. 5, which presents a block diagram illustrating a side view of a chip package 500, an optional optical source or gain material 510 may be included between optical integrated circuit 128-1 and substrate 118. For example, optional optical source 510 may be optically coupled to surface 130 of optical integrated circuit 128-1. In this case, optional optical source 510 may be thinner than the surrounding C4-type bumps.

In some embodiments, chip package 500 includes an optional thermal-cooling mechanism 512 on a surface 514 of integrated circuit 110 on an opposite side of integrated circuit 110 from surface 112. This optional thermal-cooling mechanism may include a heat sink. Moreover, optional thermal-cooling mechanism 512 may also extend to (back-side) surface 144 of optical integrated circuit 128-1. Furthermore, the heat sink may have some topology if the chips have different heights. If optical fiber 142 interfaces with surface 144, it may share space with optional thermal-cooling mechanism 512. In addition, in embodiments with optional optical source 510, chip package 500 may include an appropriate thermal-management technique for optional optical source 510.

Figure 6:
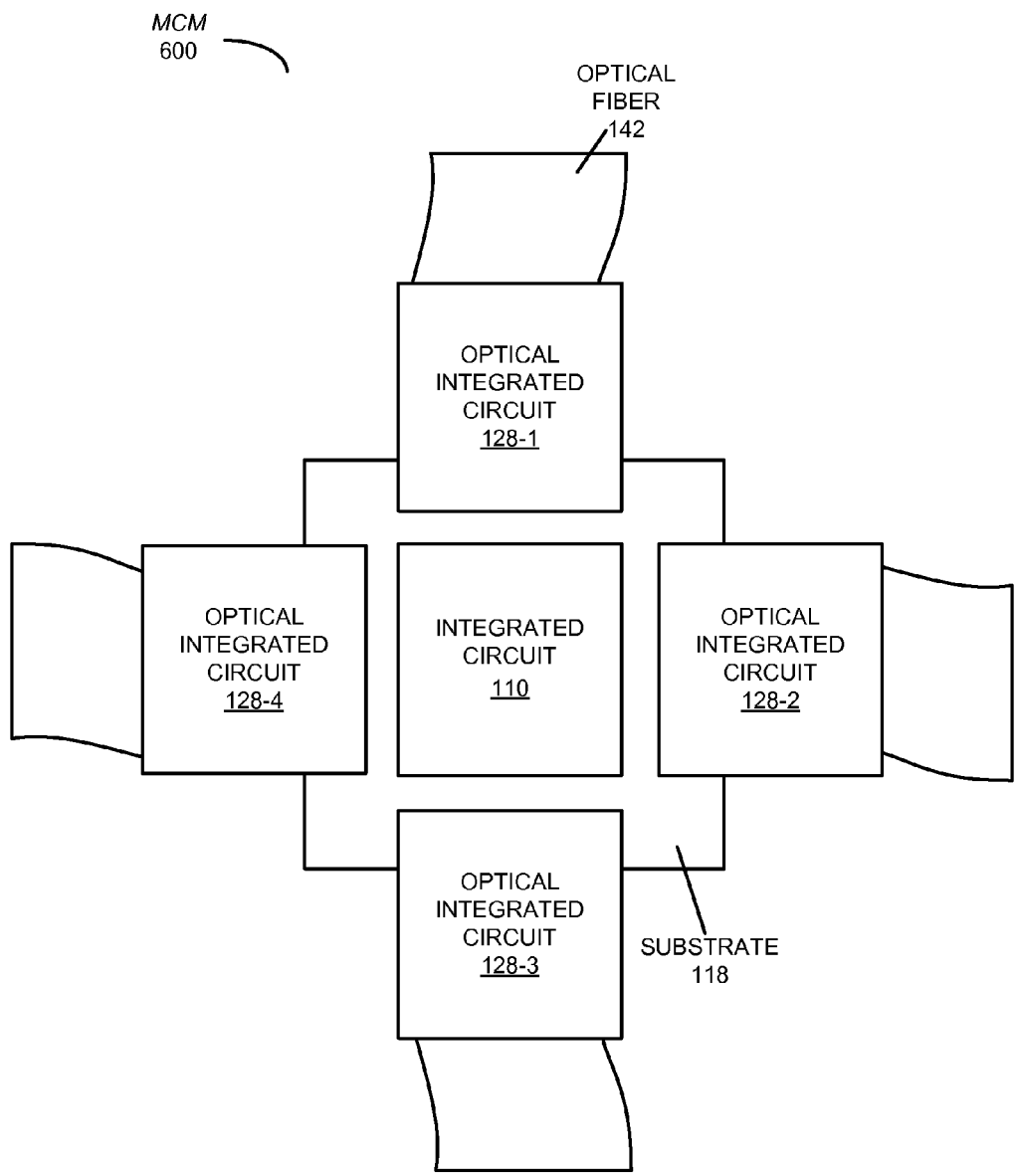
FIG. 6 is a block diagram illustrating a top view of a multi-chip module (MCM) in accordance with an embodiment of the present disclosure.

In order to maximize the number of off-chip data channels, and therefore the bandwidth, multiple optical integrated circuits 128 may be placed adjacent to each edge of integrated circuit 110. This is illustrated in FIG. 6, which presents a block diagram illustrating a top view of a multi-chip module (MCM) 600.

In an exemplary embodiment, MCM 600 is assembled by attaching the optional optical source using hybrid bonding or a fusion process. Then, the I/O integrated circuit may be hybrid integrated with optical integrated circuits 128 using fine-pitch microbumps. Moreover, integrated circuit 110 and optical integrated circuits 128 may be coupled to substrate 118 using C4-type interconnects. Furthermore, ball-grid-array interconnects may be coupled to surface 138 (FIG. 1) so substrate 118 can be attached to a printed-circuit board. Additionally, the optical fibers may be optically coupled to optical integrated circuits 128.

Figure 7:
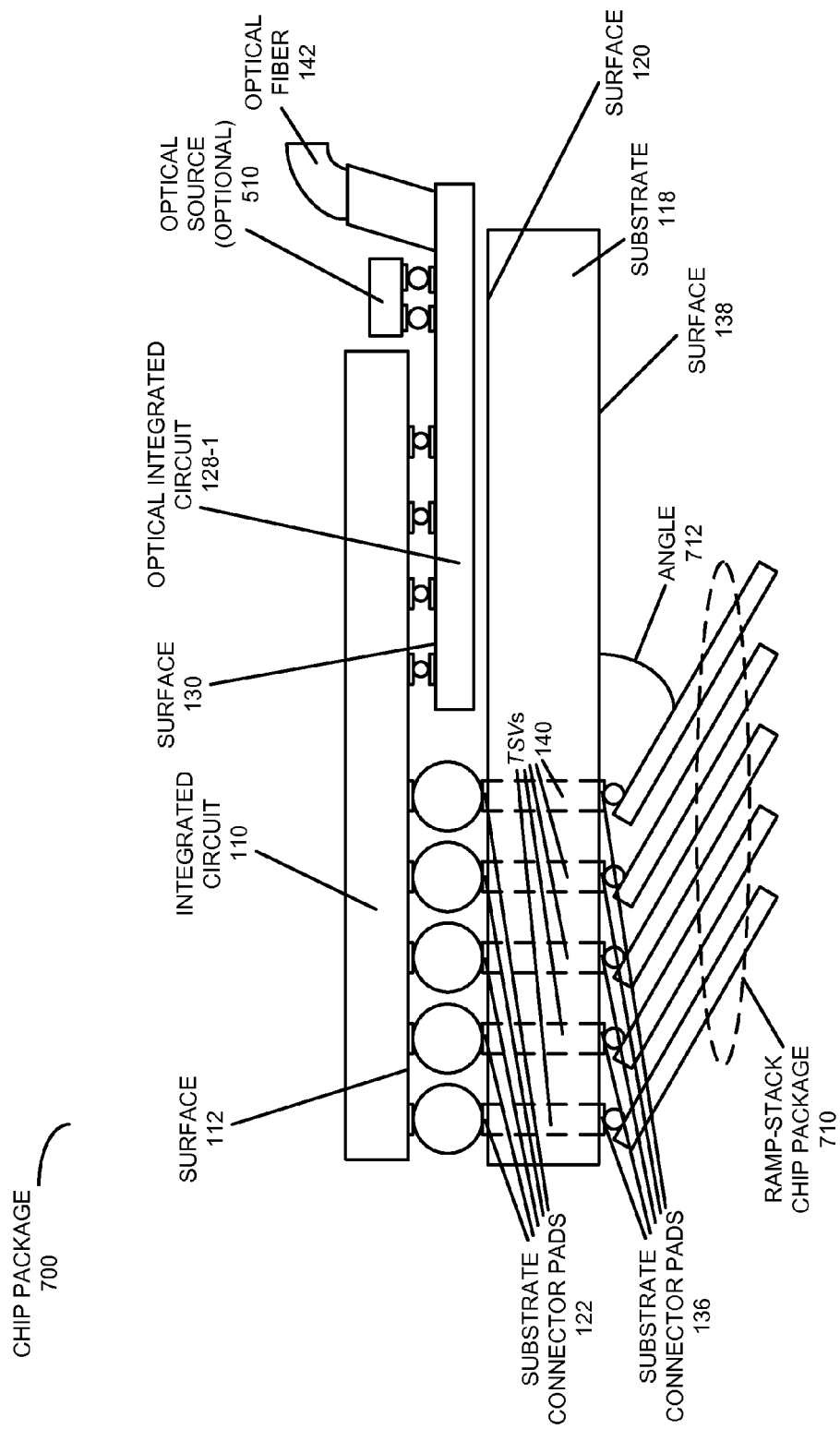
FIG. 7 is a block diagram illustrating a side view of a chip package in accordance with an embodiment of the present disclosure.

In some embodiments, the chip package includes low-latency, high-bandwidth interconnections to banks of high-density memory. This is shown in FIG. 7, which presents a block diagram illustrating a side view of a chip package 700 that includes a ramp-stack chip package 710 electrically coupled to substrate connector pads 136, where ramp-stack chip package 710 includes multiple parallel substrates arranged at an oblique angle 712 relative to surface 138. (For example, there may be as many as 80 substrates in ramp-stack chip package 710.) Moreover, substrate connector pads 136 may have a lower pitch than a pitch of substrate connector pads 122 and/or a pitch of substrate connector pads 124 in FIG. 1). Furthermore, integrated circuit 110 may be coupled to ramp-stack chip package 710 by TSVs 140 and flip-chip interconnects.

Note that ramp-stack chip package 710 may increase memory and interconnect capacity in chip package 700. While ramp-stack chip package 710 is used as an illustration in FIG. 7, in other embodiments memory stacks fabricated using other techniques, such as stacked with TSVs or assembled as vertical chips, are used.

In contrast with chip package 100 in FIG. 1, integrated circuit 110 is coupled to substrate 118 in chip package 700, and optical integrated circuit 128-1 is hybrid integrated onto integrated circuit 110. Note that optical integrated circuit 128-1 may include wavelength-division-multiplexing optical devices, and integrated circuit 110 may include optical-device driver and receiver circuits, as well as memory-controller circuitry. Moreover, chip package 700 may be constructed such that there is a point-to-point relationship between memory-control I/Os on integrated circuit 110 and I/Os of memory chips in ramp-stack chip package 710.

While not shown in FIG. 7, surface 120 may include interconnects (such as a ball-grid array) for assembling chip package 700 onto a printed-circuit board. Therefore, chips mounted on these interconnects may need to be thinner than the height of these interconnects.

In some embodiments, ramp-stack chip package 710 and optical integrated circuit 128-1 are thermally managed from the top-side of chip package 700. For example, a thermal-interface material may contact a heat-spreading feature on the mating printed-circuit board.

Figure 8:
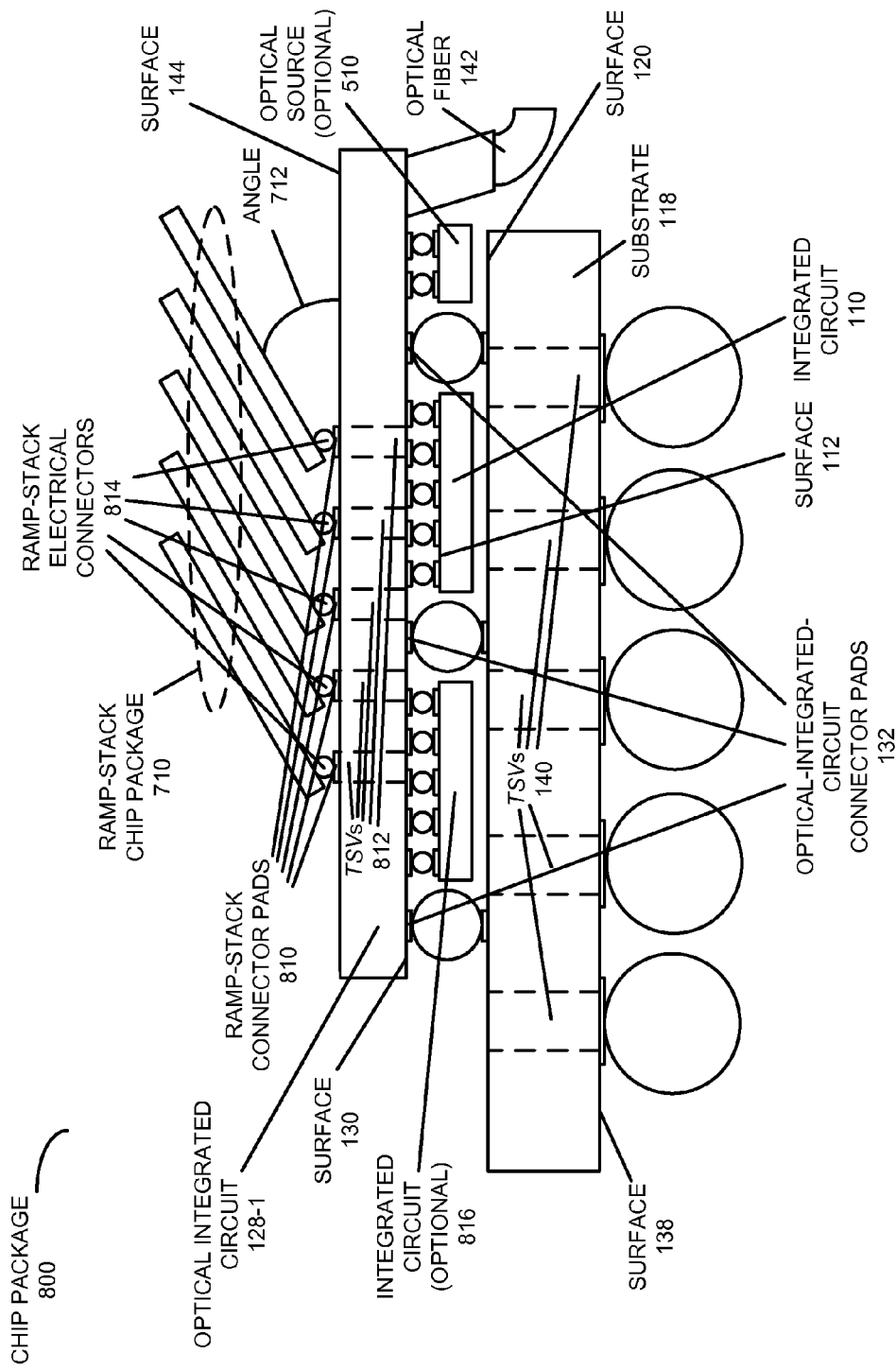
FIG. 8 is a block diagram illustrating a side view of a chip package in accordance with an embodiment of the present disclosure.

In another configuration, hybrid integration is used to bring photonic I/Os directly to a memory stack. This is shown in FIG. 8, which presents a block diagram illustrating a side view of a chip package 800 that includes: ramp-stack connector pads 810 disposed on surface 144; TSVs 812 electrically coupling optical-integrated-circuit connector pads 132 to ramp-stack connector pads 810; ramp-stack electrical connectors 814 electrically coupled to ramp-stack connector pads 810; and ramp-stack chip package 710 electrically coupled to ramp-stack electrical connectors 814, where ramp-stack chip package 710 includes the multiple parallel substrates arranged at an oblique angle 712 relative to surface 144.

In FIG. 8, surface 112 of integrated circuit 110 is coupled to surface 130 of optical integrated circuit 128-1. For example, integrated circuit 110 may be flip-chip bonded to optical integrated circuit 128-1 and integrated circuit 110 may be thinned down to a height that is less than the height or thickness of the flip-chip interconnects between optical integrated circuit 128-1 an substrate 118. In some embodiments, chip package 800 includes one or more additional instances of the integrated circuit, such as optional integrated circuit 816. These additional instances may increase the memory density and access in chip package 800.

Figure 9:
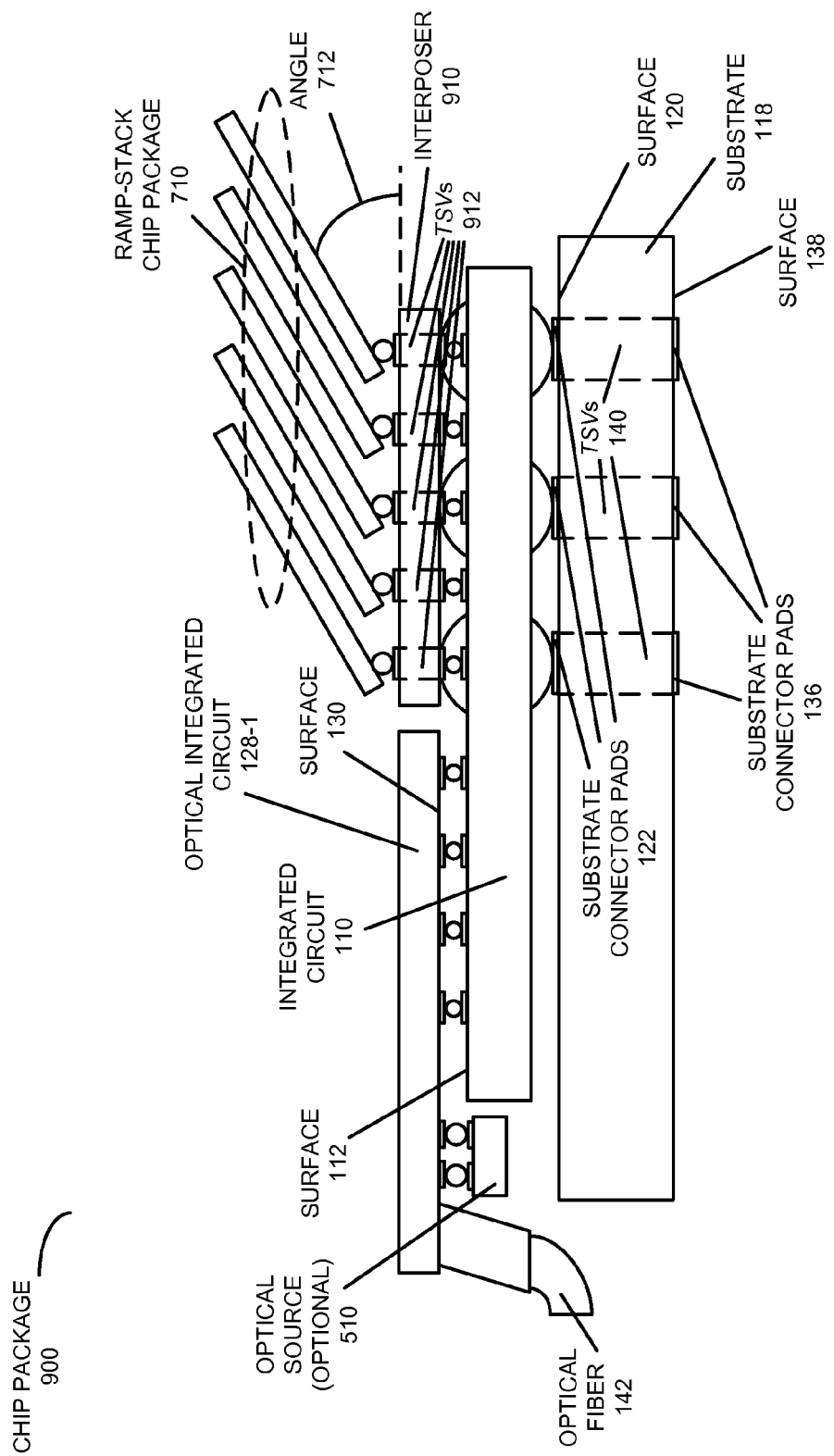
FIG. 9 is a block diagram illustrating a side view of a chip package in accordance with an embodiment of the present disclosure.

FIG. 9 presents a block diagram illustrating a side view of a chip package 900. In this chip package, ramp-stack chip package 710 is electrically coupled to one side of interposer 910, and integrated circuit 110 is coupled to the other side of interposer 910. Note that integrated circuit 110 is coupled to ramp-stack chip package 710 by TSVs 912 in interposer 910 (or through-glass vias if interposer 910 includes glass). These TSVs may have widths of 50-200 µm. Moreover, surface 112 of integrated circuit 110 is coupled to surface 130 of optical integrated circuit 128-1. However, multiple memory stacks and/or optical integrated circuits may be coupled to interposer 910 to increase memory and interconnect capacity.

Interposer 910 may support dense redistribution wiring layers on one or both sides to allow for physical transformation of pad/bump pitch between the two sides of interposer 910. In general, the integrated-circuit side of interposer 910 may have a much tighter pad pitch than the chip-package side. Furthermore, interposer 910 may be made of silicon, a glass, a ceramic and/or an organic material having a coefficient of thermal expansion that is very close to that of silicon. This feature may provide the thermo-mechanical latitude to use shorter and higher-density bumps on chips, but also to allow the chips to be bonded very close together.

Interposer 910 may also include flip-chip interconnects to assemble the entire subcomponent onto a package substrate or printed-circuit board. Therefore, chips mounted on the same side as the flip-chip interconnects (C4, copper pillars, etc.) may need to be thinner than the height of these interconnects.

In some embodiments, ramp-stack chip package 710 and optical integrated circuit 128-1 are thermally managed from the top-side of chip package 900. For example, a thermal-interface material may contact a heat-spreading feature on the mating printed-circuit board.

Figure 10:
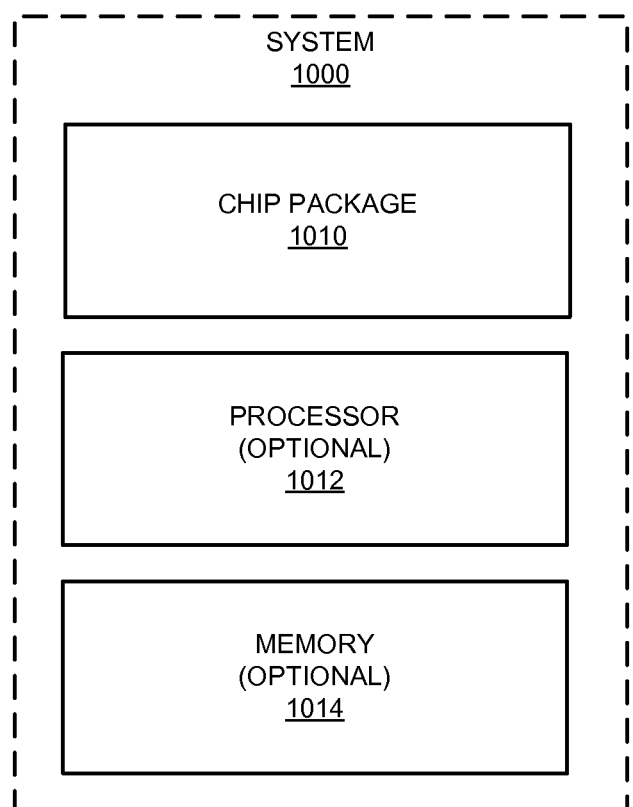
FIG. 10 is a block diagram illustrating a system that includes a chip package in accordance with an embodiment of the present disclosure.

Embodiments of the chip package may be used in a wide variety of applications. FIG. 10 presents a block diagram illustrating a system 1000 that includes a chip package 1010, such as one of the preceding embodiments of the chip package. This system may include an optional processor 1012 and/or an optional memory 1014, which may be coupled to each other and chip package 1010 by a bus (not shown). Note that optional processor (or processor core) 1012 may support parallel processing and/or multi-threaded operation.

Optional memory 1014 in system 1000 may include volatile memory and/or non-volatile memory. More specifically, optional memory 1014 may include: ROM, RAM, EPROM, EEPROM, flash, one or more smart cards, one or more magnetic disc storage devices, and/or one or more optical storage devices. Moreover, optional memory 1014 may store an operating system that includes procedures (or a set of instructions) for handling various basic system services for performing hardware-dependent tasks. Moreover, optional memory 1014 may also store communications procedures (or a set of instructions) in a communication module. These communication procedures may be used for communicating with one or more computers, devices and/or servers, including computers, devices and/or servers that are remotely located with respect to the system 1000.

Furthermore, optional memory 1014 may also include one or more program modules (or sets of instructions). Note that the one or more program modules may constitute a computer-program mechanism. Instructions in the various modules in optional memory 1014 may be implemented in: a high-level procedural language, an object-oriented programming language, and/or in an assembly or machine language. The programming language may be compiled or interpreted, i.e., configurable or configured, to be executed by optional processor (or processor core) 1012.

System 1000 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, an electronic device, and/or another electronic computing device.

Note that embodiments of the chip package may be used in a variety of applications, including: VLSI circuits, communication systems (such as in wavelength division multiplexing), storage area networks, data centers, networks (such as local area networks), memory systems and/or computer systems (such as multiple-core processor computer systems). For example, the chip package may be included in a backplane that is coupled to multiple processor blades, or the chip package may couple different types of components (such as processors, memory, input/output devices, and/or peripheral devices). Thus, the chip package may perform the functions of: a switch, a hub, a bridge, and/or a router.

In general, system 1000 may be at one location or may be distributed over multiple, geographically dispersed locations. Moreover, some or all of the functionality of system 1000 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. For example, components in the chip package may be electrically coupled to each other using proximity-communication (P×C) connectors on surfaces of the components, such as: capacitive P×C connectors, inductive P×C connectors, conductive P×C connectors, and/or optical P×C connectors. Alternatively or additionally, the connectors may include compression-compliant microspring connectors. Moreover, components or features in one in embodiment may be used in another of the embodiments.

The chip package may also include additional features that facilitate assembly and that may help maintain in-plane (XY) alignment of components. In particular, components (such as integrated circuit 110 and/or optical integrated circuit 128-1 in FIG. 1) may be mechanically coupled to substrate 118 in FIG. 1 by pairs of negative features on surfaces and positive features that mate with the corresponding pairs of negative features. For example, the negative features may include pits that are recessed below surfaces 112, 120 and 130 in FIG. 1, and the positive features may include spherical balls that mate with the negative features (such as a ball-and-etch-pit structure), thereby aligning the components. (Alternatively or additionally, alignment in the chip package may be facilitated using positive features on surfaces 112, 120 and 130 in FIG. 1, where these positive features protrude above these surfaces). In some embodiments, the pairs of negative features are proximate to corners of the components.

As noted above, mating the negative features and the positive features can provide highly accurate self-alignment in the XY plane of the components, as well as coplanarity control during assembly. For example, the alignment over surfaces 112, 120 and/or 130 in FIG. 1 may be within ±1 μm in the XY plane.

In some embodiments, components in the chip package are permanently attached after remateable alignment, for example, by using a post-alignment technique to permanently fix the chip-to-chip alignment. In particular, solder may be partially melted or reflowed at an elevated temperature to fuse components in the chip package to create a more permanent bond. However, in other embodiments, components in the chip package are remateably coupled, thereby facilitating rework of the chip package.

Moreover, although the chip package and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that surfaces on components should be understood to include surfaces of substrates or surfaces of layers deposited on these substrates (such as a dielectric layer deposited on a substrate). Additionally, note that components in the chip package may be fabricated, and the chip package may be assembled, using a wide variety of techniques, as is known to one of skill in the art.

We now describe the method. FIG. 11 presents a flow diagram illustrating a method 1100 for communicating electrical signals between an integrated circuit and an optical integrated circuit, such as an integrated circuit and an optical integrated circuit in one of the preceding embodiments of the chip package. During the method, the electrical signals are conveyed from integrated-circuit connector pads on a front surface of the integrated circuit to first substrate connector pads on a surface of a substrate via the integrated-circuit electrical connectors (operation 1110), where the front surface faces the top surface. Then, the electrical signals are conveyed via traces disposed on the substrate (operation 1112), where the traces electrically couple the first substrate connector pads and second substrate connector pads on the top surface. Moreover, the electrical signals are conveyed from the second substrate connector pads on the surface to optical-integrated-circuit connector pads on a front surface of the optical integrated circuit via the optical-integrated-circuit electrical connectors (operation 1114), where the front surface of the optical integrated circuit faces the top surface, and the optical integrated circuit is proximate to the integrated circuit on the same side of the substrate. Next, the electrical signals are communicated from the front surface of the optical integrated circuit to I/O integrated circuit (operation 1116) between the front surface of the optical integrated circuit and the substrate. Furthermore, the electrical signals and/or optical signals are communicated with optical devices of the optical integrated circuit (operation 1118) using the I/O integrated circuit.

In some embodiments, method 1100 includes additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
   an integrated circuit having a front surface with integrated-circuit connector pads;
   integrated-circuit electrical connectors electrically coupled to the integrated-circuit connector pads;
   a substrate having a top surface, facing the front surface, with first substrate connector pads electrically coupled to the integrated-circuit electrical connectors, and second substrate connector pads;
   optical-integrated-circuit electrical connectors electrically coupled to the second substrate connector pads;
   an optical integrated circuit having a front surface, facing the top surface, with optical-integrated-circuit connector pads electrically coupled to the optical-integrated-circuit electrical connectors, wherein the optical integrated circuit is proximate to the integrated circuit on a same side of the substrate, and wherein the optical integrated circuit is configured to communicate optical signals; and
   an input/output (I/O) integrated circuit between the front surface of the optical integrated circuit and the top surface of the substrate, wherein the I/O integrated circuit is coupled to the optical integrated circuit; and
   wherein the I/O integrated circuit includes electrical I/O circuits and optical driver and receiver circuits;
   ramp-stack connector pads disposed on a back surface on an opposite side of the optical integrated circuit from the front surface;
   through-substrate vias (TSVs) electrically coupling the optical-integrated-circuit connector pads to the ramp-stack connector pads;
   ramp-stack electrical connectors electrically coupled to the ramp-stack connector pads; and
   a ramp-stack chip package electrically coupled to the ramp-stack electrical connectors, wherein the ramp-stack chip package includes multiple parallel substrates arranged at an oblique angle relative to the back surface.

2. The chip package of claim 1, wherein the integrated circuit is adjacent to the optical integrated circuit.

3. The chip package of claim 1, wherein the substrate further includes:
   third substrate connector pads disposed on a bottom surface on an opposite side of the substrate from the top surface; and
   through-substrate vias (TSVs) electrically coupling the first substrate connector pads to the third substrate connector pads, and the second substrate connector pads to the third substrate connector pads.

4. The chip package of claim 3, wherein the TSVs are configured to convey power and ground to the integrated circuit and the optical integrated circuit.

5. The chip package of claim 3, wherein the chip package further includes a ramp-stack chip package electrically coupled to the third substrate connector pads, and
   wherein the ramp-stack chip package includes multiple parallel substrates arranged at an oblique angle relative to the bottom surface.

6. The chip package of claim 3, wherein the third substrate connector pads have a lower pitch than a pitch of the first substrate connector pads and a pitch of the second substrate connector pads.

7. The chip package of claim 1, wherein the I/O integrated circuit is configured to communicate with the integrated circuit via the substrate.

8. The chip package of claim 1, wherein the chip package further includes an optical fiber edge coupled to the optical integrated circuit.

9. The chip package of claim 1, wherein the chip package further includes an optical fiber vertically coupled to the optical integrated circuit.

10. The chip package of claim 9, wherein the optical fiber is coupled to the front surface of the optical integrated circuit.

11. The chip package of claim 9, wherein the optical fiber is coupled to a back surface of the optical integrated circuit on an opposite side of the optical integrated circuit from the front surface of the optical integrated circuit.

12. The chip package of claim 1, wherein the chip package further includes an optical source between the optical integrated circuit and the substrate; and
    wherein the optical source is optically coupled to the front surface of the optical integrated circuit.

13. The chip package of claim 1, wherein the substrate includes one of: a ceramic, an organic material, a glass, and a semiconductor.

14. The chip package of claim 1, wherein the chip package further includes a thermal-cooling mechanism on a back surface of the integrated circuit on an opposite side of the integrated circuit from the front surface of the integrated circuit.

15. The chip package of claim 1, wherein the chip package further includes an interposer between the front surface of the integrated circuit and the top surface of the substrate.

16. A system, comprising:
    a processor;
    a memory coupled to the processor; and
    a chip package, wherein the chip package includes:
    an integrated circuit having a front surface with integrated-circuit connector pads;
    integrated-circuit electrical connectors electrically coupled to the integrated-circuit connector pads;

a substrate having a top surface, facing the front surface, with first substrate connector pads electrically coupled to the integrated-circuit electrical connectors, and second substrate connector pads;

optical-integrated-circuit electrical connectors electrically coupled to the second substrate connector pads;

an optical integrated circuit having a front surface, facing the top surface, with optical-integrated-circuit connector pads electrically coupled to the optical-integrated-circuit electrical connectors, wherein the optical integrated circuit is proximate to the integrated circuit on a same side of the substrate, and wherein the optical integrated circuit is configured to communicate optical signals; and an input/output (I/O) integrated circuit between the front surface of the optical integrated circuit and the top surface of the substrate, wherein the I/O integrated circuit is coupled to the optical integrated circuit; and wherein the I/O integrated circuit includes electrical I/O circuits and optical driver and receiver circuits;

ramp-stack connector pads disposed on a back surface on an opposite side of the optical integrated circuit from the front surface;

through-substrate vias (TSVs) electrically coupling the optical-integrated-circuit connector pads to the ramp-stack connector pads;

ramp-stack electrical connectors electrically coupled to the ramp-stack connector pads; and a ramp-stack chip package electrically coupled to the ramp-stack electrical connectors, wherein the ramp-stack chip package includes multiple parallel substrates arranged at an oblique angle relative to the back surface.

17. The system of claim 16, wherein the integrated circuit is adjacent to the optical integrated circuit.

18. The system of claim 16, wherein the I/O integrated circuit is configured to communicate with the integrated circuit via the substrate.

19. A method for communicating electrical signals between an integrated circuit and an optical integrated circuit, wherein the method comprises:

conveying the electrical signals from integrated-circuit connector pads on a front surface of the integrated circuit to first substrate connector pads on a top surface of an substrate via integrated-circuit electrical connectors, wherein the front surface faces the top surface;

conveying the electrical signals via traces disposed on the substrate, wherein the traces electrically couple the first substrate connector pads and second substrate connector pads on the top surface;

conveying the electrical signals from the second substrate connector pads to optical-integrated-circuit connector pads on a front surface of the optical integrated circuit via optical-integrated-circuit electrical connectors, wherein the front surface of the optical integrated circuit faces the top surface, and wherein the optical integrated circuit is proximate to the integrated circuit on a same side of the substrate, wherein ramp-stack connector pads are disposed on a back surface on an opposite side of the optical integrated circuit from the front surface, wherein the ramp-stack connector pads are electrically coupled to the optical-integrated-circuit connector pads via though-substrate vias, wherein ramp-stack electrical connectors are electrically coupled to the ramp-stack connector pads, and wherein a ramp-stack chip package is electrically coupled to the ramp-stack electrical connectors, wherein the ramp-stack chip package includes multiple parallel substrates arranged at an oblique angle relative to the back surface;

communicating the electrical signals from the front surface of the optical integrated circuit to an input/output (I/O) integrated circuit between the front surface of the optical integrated circuit and the substrate; and communicating with optical devices of the optical integrated circuit using the I/O integrated circuit.

* * * * *

UNITED STATES PATENT AND TRADEMARK OFFICE
CERTIFICATE OF CORRECTION

| | | |
|---|---|---|
| PATENT NO. | : 8,971,676 B1 | Page 1 of 1 |
| APPLICATION NO. | : 14/047918 | |
| DATED | : March 3, 2015 | |
| INVENTOR(S) | : Thacker et al. | |

It is certified that error appears in the above-identified patent and that said Letters Patent is hereby corrected as shown below:

In the specification

In column 2, line 23, delete "data" and insert -- data. --, therefor.

In column 6, line 47, delete "minors," and insert -- mirrors, --, therefor.

Signed and Sealed this
Thirteenth Day of October, 2015

Michelle K. Lee
*Director of the United States Patent and Trademark Office*